(12) United States Patent
Kubo

(10) Patent No.: US 7,184,129 B2
(45) Date of Patent: Feb. 27, 2007

(54) POSITIONING METHOD, AND POSITIONING APPARATUS

(75) Inventor: Tadayuki Kubo, Ibaragi (JP)

(73) Assignee: Canon Kabushiki Kaisha, Tokyo (JP)

( * ) Notice: Subject to any disclaimer, the term of this patent is extended or adjusted under 35 U.S.C. 154(b) by 454 days.

(21) Appl. No.: 10/891,037

(22) Filed: Jul. 15, 2004

(65) Prior Publication Data

US 2005/0018161 A1   Jan. 27, 2005

(30) Foreign Application Priority Data

Jul. 23, 2003  (JP) .............................. 2003-200197

(51) Int. Cl.
*G03B 27/58* (2006.01)
(52) U.S. Cl. ......................... 355/72; 355/75
(58) Field of Classification Search .................... None
See application file for complete search history.

(56) References Cited

U.S. PATENT DOCUMENTS 5,280,677 A    1/1994  Kubo et al. ................... 33/568
6,408,045 B1   6/2002  Matsui et al. ................. 378/34
6,639,654 B2 * 10/2003 Binnard et al. ............... 355/72
6,644,855 B2  11/2003  Sakino et al. .................. 384/9
2004/0046294 A1 3/2004 Kubo et al. ................. 267/136

FOREIGN PATENT DOCUMENTS

JP    5-109871    4/1993
JP    7-308834    11/1995

* cited by examiner

*Primary Examiner*—D. Rutledge
(74) *Attorney, Agent, or Firm*—Fitzpatrick, Cella, Harper & Scinto

(57) ABSTRACT

A positioning method that includes a step of moving a stage apparatus for supporting a workpiece or an object to be measured from an auxiliary mount to a positioning mount using a rolling guide extending from the positioning mount onto the auxiliary mount, a step of lifting the stage apparatus moved to the positioning mount using a lifting unit to extract the rolling guide, and a step of lowering the stage apparatus onto the positioning mount, from which the rolling guide is extracted, to cause the stage apparatus to abut a reference member and to position the stage apparatus, while hydrostatically supporting the stage apparatus by a hydrostatic bearing unit. A positioning apparatus for performing a positioning method is also set forth.

6 Claims, 8 Drawing Sheets

POSITIONING METHOD, AND POSITIONING APPARATUS

This application claims priority from Japanese Patent Application No. 2003-200197 filed Jul. 23, 2003, which is hereby incorporated by reference herein.

BACKGROUND OF THE INVENTION

1. Field of the Invention

The present invention relates to a positioning method and a positioning apparatus, which are capable of quickly and precisely positioning or aligning even a very heavy stage apparatus for supporting a wafer, a mask, an object to be measured (e.g., a measurement object), or the like, in assemblages of a semiconductor exposure apparatus, an electron-beam drawing apparatus, a precise measuring instrument, and the like.

2. Description of the Related Art

In assemblages of an exposure apparatus for producing a semiconductor, an electron-beam drawing apparatus, a precise measuring instrument, and the like, it is required that the stage apparatus for supporting a wafer, a mask, a measurement object, or the like, be quickly and precisely positioned relative to an exposure optical system, and the like. There has been proposed a conventional positioning apparatus for performing, for example, pre-alignment of a substrate, such as a glass plate, which is to be mounted on a semiconductor exposure apparatus, an exposure apparatus for producing a liquid crystal display device, and the like, a working apparatus, or an inspection apparatus, as disclosed in Japanese Patent Application Laid-Open No. 5-109871 (1993). In such a disclosed positioning apparatus, which is illustrated in FIG. 9 of this application, when pre-alignment is executed by pressing a substrate P on a holder 103 against reference rollers 104A, 104B and 104C using two pressing rollers 104D and 104E for providing forces in two directions, respectively, pressing forces generated by the pressing rollers 104D and 104E at the time of positioning are made small, and a sensor 125 for generating a positioning-completion signal is used in order to prevent an occurrence of mechanical distortion (deformation) of the substrate P.

Further, Japanese Patent Application Laid-Open No. 7-308834 (1995) discloses, as illustrated in FIG. 10 of this application, a moving table in which guide rails 212a to 212d are fixed to a movable mount 218 and a stationary base 219, respectively, and the movable mount 218 is movably supported on balls 211.

However, the positioning apparatuses discussed above are to be used for positioning a relatively-light substrate, and it is, hence, difficult to adapt these apparatuses to the positioning of a heavy stage apparatus. More specifically, if a heavy body is moved on the holder by the pressing rollers in the apparatus shown in FIG. 9, there is a danger that its installation surface is rubbed and becomes damaged. Furthermore, since the frictional resistance is large, it is difficult to accurately press the body against the three reference rollers, so that a partially-butting condition is likely to occur.

In the latter apparatus, as shown in FIG. 10, and assuming that the movable mount is a heavy body to be positioned, its rigidity is low because the body is supported by the balls even after the positioning. Accordingly, the apparatus cannot be applied to highly-precise positioning.

SUMMARY OF THE INVENTION

It is an object of the present invention to provide a positioning method and a positioning apparatus, which are capable of quickly, safely and highly precisely positioning or aligning even a very heavy stage apparatus relative to a base, on which the stage apparatus is to be installed, in assemblages of a body of apparatuses, such as an exposure apparatus, an electron-beam drawing apparatus, and a precise measuring instrument.

According to one aspect, the present invention provides a positioning method, which includes a step of moving a stage apparatus for supporting a workpiece or an object to be measured from an auxiliary mount to a positioning mount using a rolling guide extending from the positioning mount onto the auxiliary mount, a step of lifting the stage apparatus moved to the positioning mount using a lifting unit to extract the rolling guide, and a step of lowering the stage apparatus onto the positioning mount, from which the rolling guide is extracted, to cause the stage apparatus to abut a reference member and to position the stage apparatus, while hydrostatically supporting the stage apparatus by a hydrostatic bearing unit.

According to another aspect, the present invention provides a positioning apparatus, which includes a positioning mount with a reference member and a supporting surface for positioning a stage apparatus for supporting a workpiece or an object to be measured, an auxiliary mount with a movement surface forming an extension portion of the supporting surface of the positioning mount, a rolling guide for movably supporting the stage apparatus on the supporting surface and the movement surface, a hydrostatic bearing unit for establishing a non-contact relationship between the stage apparatus and the supporting surface, and a lifting unit for lifting the stage apparatus from the supporting surface. The rolling guide may further include a lower-side guide plate provided on the supporting surface and the movement surface in a detachably attachable manner, an upper-side guide plate provided on a bottom surface of the stage apparatus in a detachably attachable manner, and a plurality of rollers rotatably held between the lower-side guide plate and the upper-side guide plate.

The above and other objects, features, and advantages of the invention will become more apparent from the following detailed description taken in conjunction with the accompanying drawings.

DESCRIPTION OF THE PREFERRED EMBODIMENTS

Preferred embodiments of the present invention will hereinafter be described with reference to the accompanying drawings.

Figure 1A:
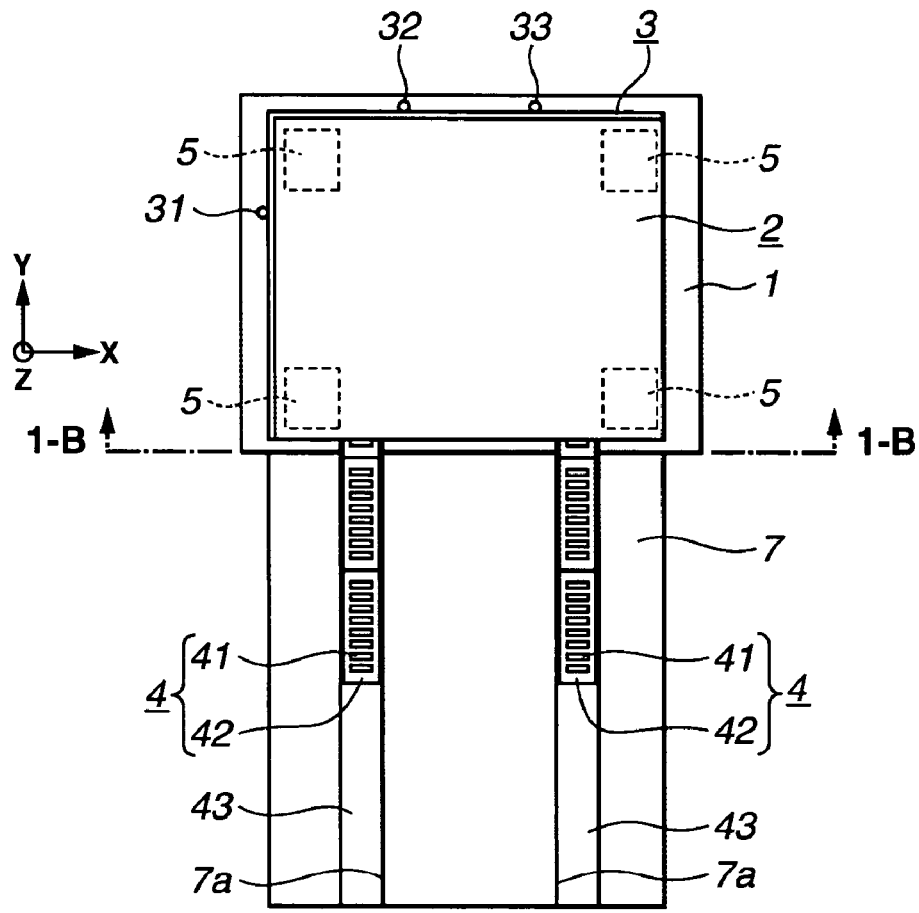
FIG. 1A is a plan view illustrating a first embodiment of a positioning apparatus according to the present invention.
Figure 1B:
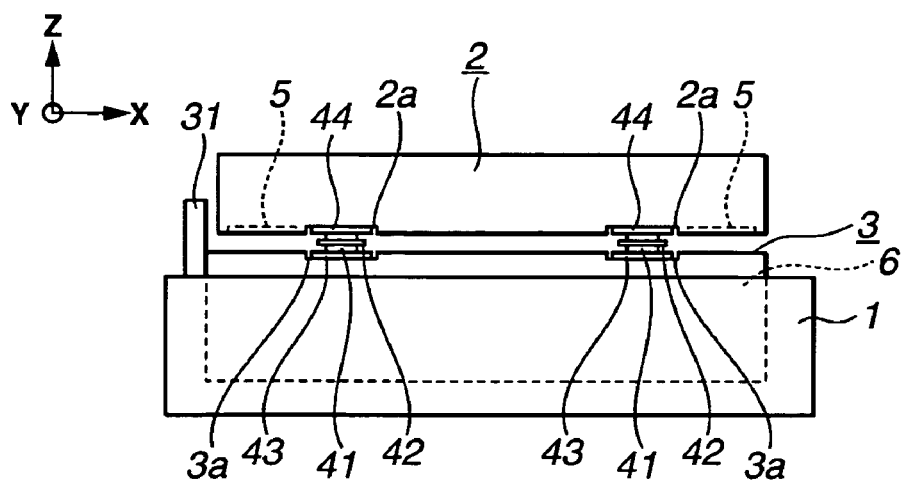
FIG. 1B is an elevational view taken from a line 1B—1B of FIG. 1A.

A first embodiment of the present invention will be described with reference to FIGS. 1A and 1B. The first embodiment is directed to a positioning apparatus constituting a positioning body portion of an exposure apparatus, an electron-beam drawing apparatus, a precise measuring instrument, or the like. On a base 1 serving as a stationary base, there are arranged a positioning mount 3 for positioning a stage apparatus 2 for supporting a substrate, such as a wafer, which is a workpiece or a measurement object, and a pair of guides 4 serving as a rolling guide interposed between the stage apparatus 2 and the positioning mount 3 in a detachably attachable manner. Each guide 4 includes a plurality of rollers 41 serving as a rolling member, a plate-like retainer 42 with holes for holding the rollers 41, a lower-side guide plate 43 in contact with (abutting) lower sides of the rollers 41, and an upper-side guide plate 44 in contact with (abutting) upper sides of the rollers 41. The upper-side guide plate 44 fits into a guide groove 2a formed on a lower surface of the stage apparatus 2 in a detachably attachable manner, and the lower-side guide plate 43 fits into a guide groove 3a formed on an upper surface of the positioning mount 3 in a detachably attachable manner.

On the positioning mount 3, are provided, in a stand-up fashion, reference members 31 to 33 for positioning the stage apparatus 2 in the X and Y directions, respectively. A bottom surface of the stage apparatus 2 constitutes a reference surface that can be freely brought into contact (abutment) with a supporting surface (an upper surface) of the positioning mount 3.

The stage apparatus 2 is provided with hydrostatic bearings 5 serving as a hydrostatic bearing unit that faces the upper surface of the positioning mount 3. In the event that the stage apparatus 2 is positioned while being in contact (abutment) with the reference members 31 to 33 (as discussed later) after each guide 4 is extracted while the stage apparatus 2 is lifted from the base 1, the stage apparatus 2 is floated from the positioning mount 3 by the hydrostatic bearings 5.

Figure 2:
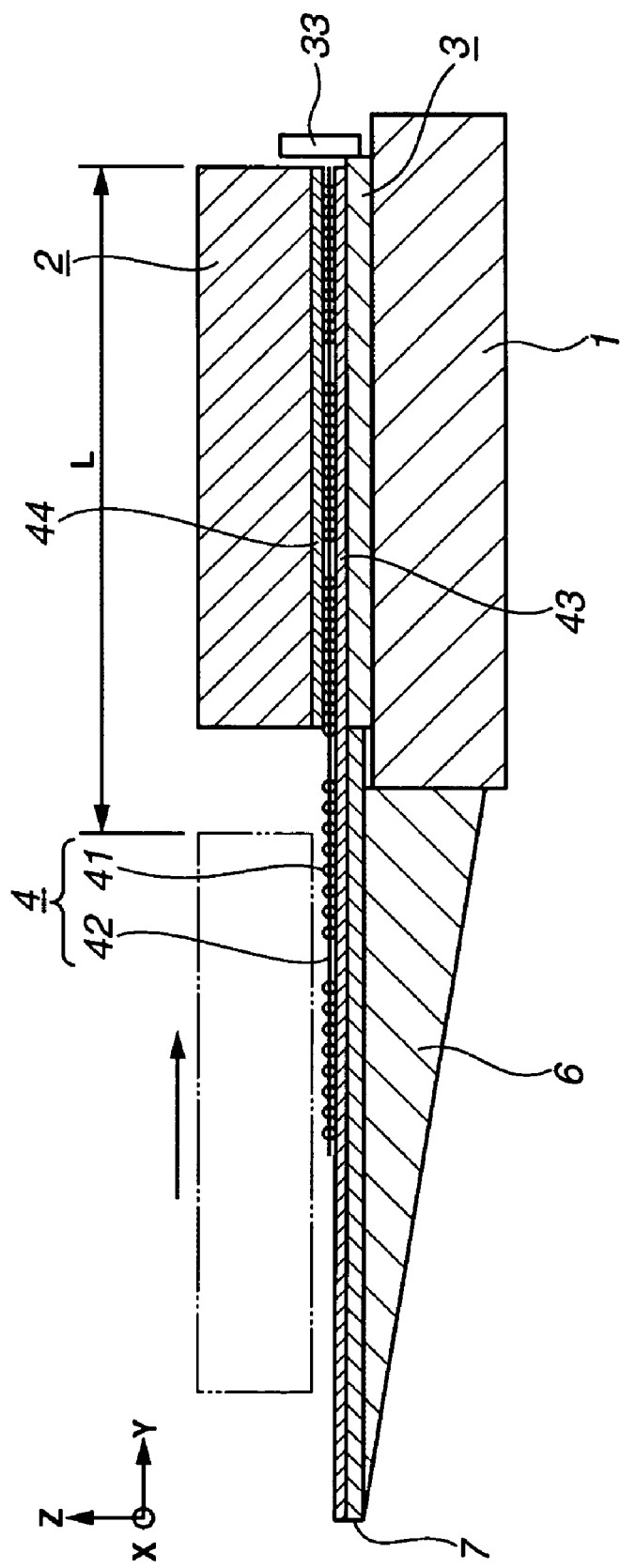
FIG. 2 is a cross-sectional view illustrating the apparatus of FIGS. 1A and 1B.

As illustrated in FIG. 2, a detachably-attachable auxiliary base 6 is in contact (abutment) with an end surface of the base 1, an auxiliary mount 7 is installed on the auxiliary base 6, and an upper surface of the auxiliary mount 7 constitutes a movement surface that is an extension portion from the supporting surface of the positioning mount 3. The lower-side guide plate 43 extends from the guide groove 3a (FIG. 1B) of the positioning mount 3 into a guide groove 7a (FIG. 1A) formed on the auxiliary mount 7, and is capable of lightly moving the stage apparatus 2 installed on the auxiliary mount 7 up to the positioning mount 3 on the base 1 by means of rolling motions of the rollers 41. In this event, the guide 4 moves by an around L/2 while the stage apparatus 2 moves by a movement amount L. Accordingly, the minimum necessary length of the guide 4 is equal to or more than a value of the length of the stage apparatus 2 plus the movement amount L/2.

Further, the height and inclination of the auxiliary mount 7 are so adjusted as to be approximately equal to those of the positioning mount 3. The upper-side guide plate 44 moves together with the stage apparatus 2, and the lower-side guide plate 43 extends over an almost overall length of the positioning mount 3 and the auxiliary mount 7 so as to cover a connection portion therebetween. Since the lower-side guide plate 43 covers the connection portion between the positioning mount 3 and the auxiliary mount 7, the roller 41 can pass the connection portion without any engagement, even if there is a step or an inclination at the connection portion.

Figure 3:
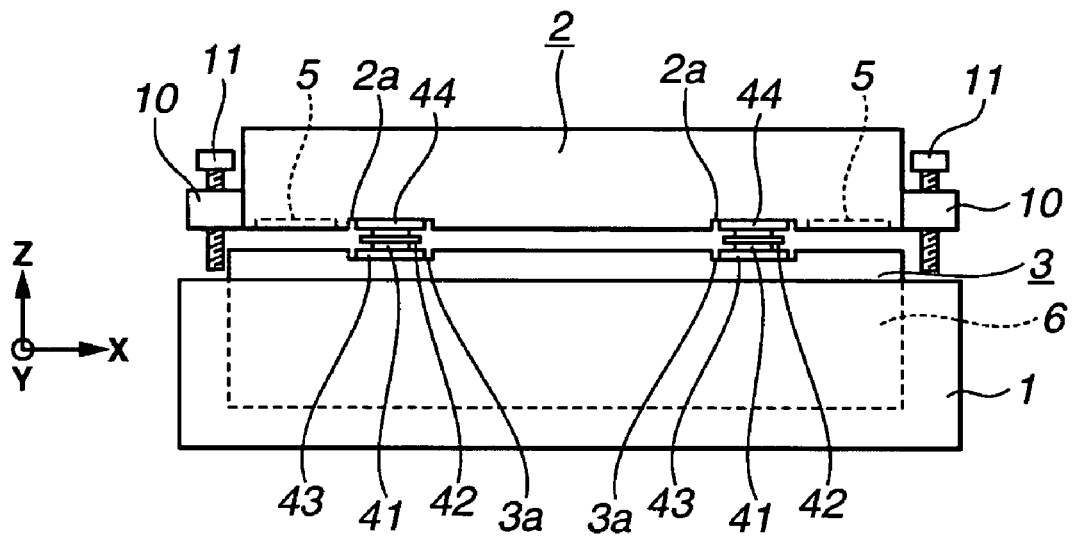
FIG. 3 is a view illustrating a lifting unit for lifting a stage apparatus from a positioning mount.

Under a condition in which the stage apparatus 2 is moved to a place near the reference members 32 and 33 of the positioning mount 3, as illustrated in FIG. 3, the stage apparatus 2 is lifted by a screw 11 serving as a lifting unit penetrating a screw block 10 of the stage apparatus 2, and the stage apparatus 2 is settled on the positioning mount 3 by retracting the screw 11 again after both the guides 4 are extracted and the auxiliary mount 7 and the auxiliary base 6 are detached. Here, the upper-side and lower-side guide plates 43 and 44 can be extracted together with the guides 4.

Then, upon supply of compressed air to the hydrostatic bearings 5 through a pipe (not shown), the compressed air is injected toward the positioning mount 3, and the stage apparatus 2 is caused to float from the positioning mount 3 and supported by the hydrostatic pressure in a non-contact fashion. Under this condition, the stage apparatus 2 is moved in the X and Y directions, and brought into contact (abutment) with the individual reference members 31 to 33. Thus, the positioning of the stage apparatus 2 is performed as illustrated in FIGS. 5A and 5B.

Because the stage apparatus 2 is caused to float by the hydrostatic bearing 5, no stick-slip motion occurs, and the stage apparatus 2 can be brought into contact (abutment) with the reference members 31 to 33 and positioned very lightly, accurately and quickly by using only a small force.

Figure 4:
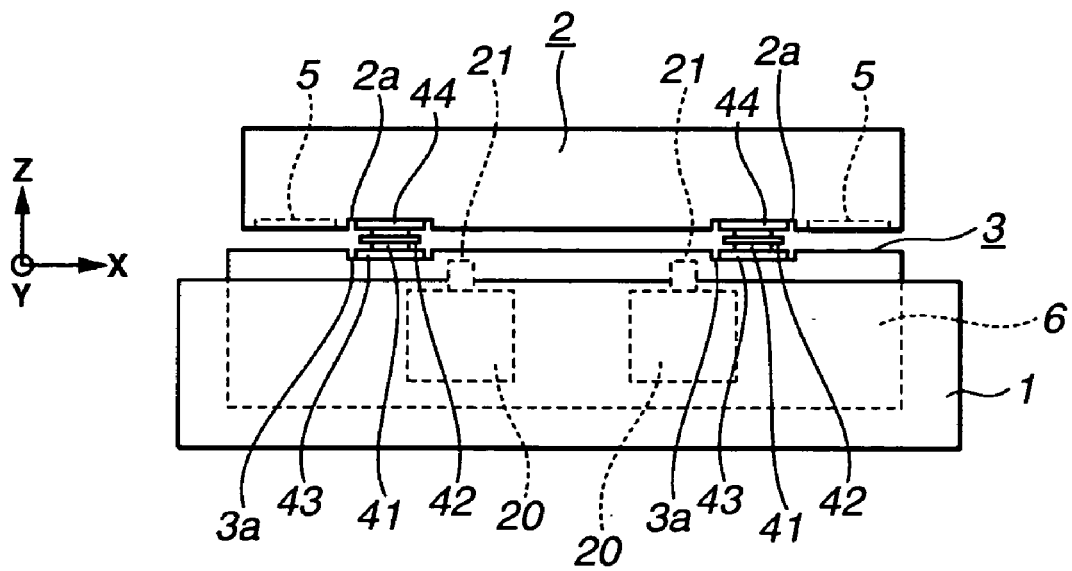
FIG. 4 is a view illustrating another lifting unit for lifting the stage apparatus from the positioning mount.

In place of the screw 11 for lifting the positioning mount 3 from the stage apparatus 2, a cylinder mechanism serving as a lifting unit can be used, as illustrated in FIG. 4. This cylinder mechanism includes a cylinder 20 buried in the base 1 and a piston 21 that is to be brought into contact (abutment) with the lower surface of the stage apparatus 2 to lift the stage apparatus 2.

Figure 5A:
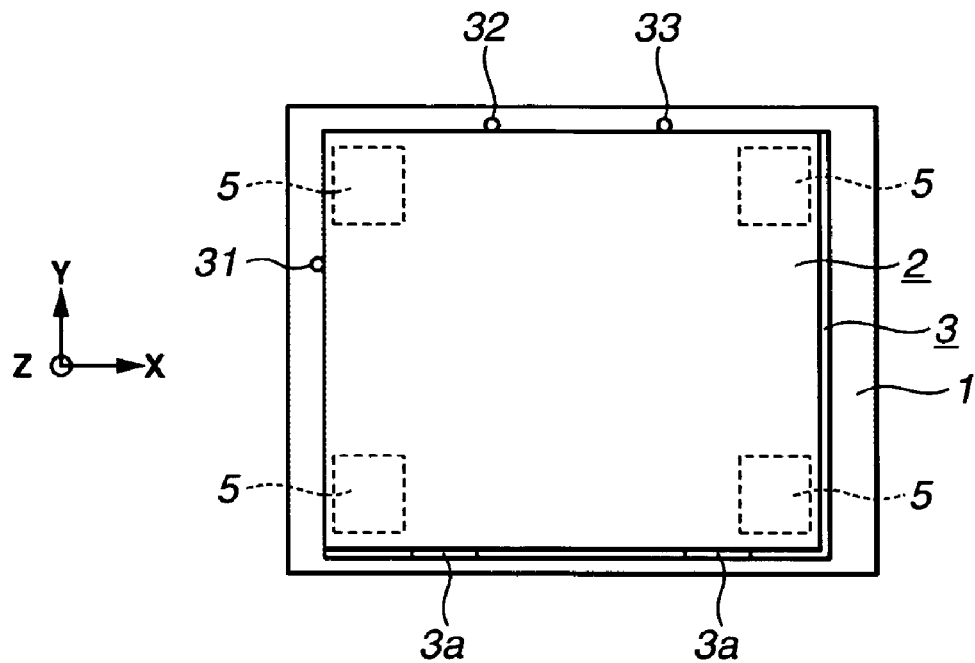
FIG. 5A is a plan view illustrating a state in which the stage apparatus is positioned on the positioning mount with respect to X and Y directions.
Figure 5B:
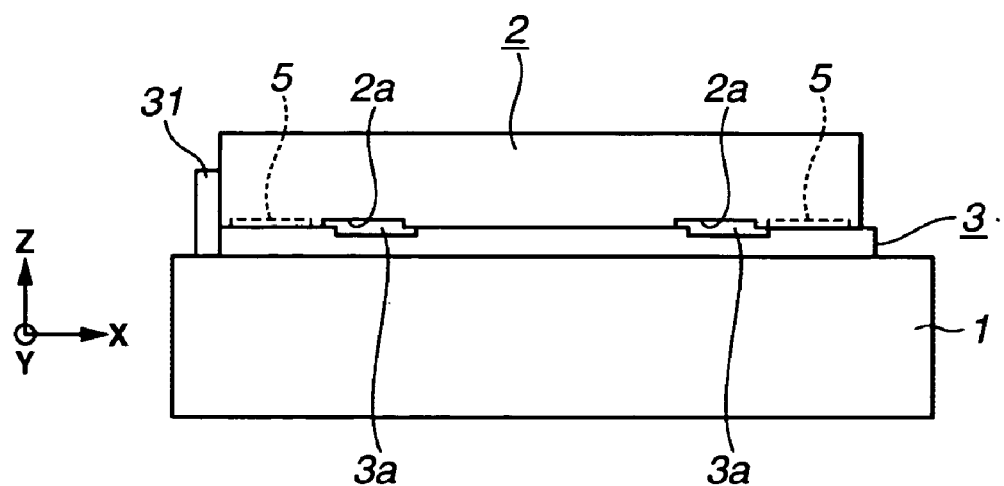
FIG. 5B is an elevational view of the apparatus shown in FIG. 5A.
Figure 6:
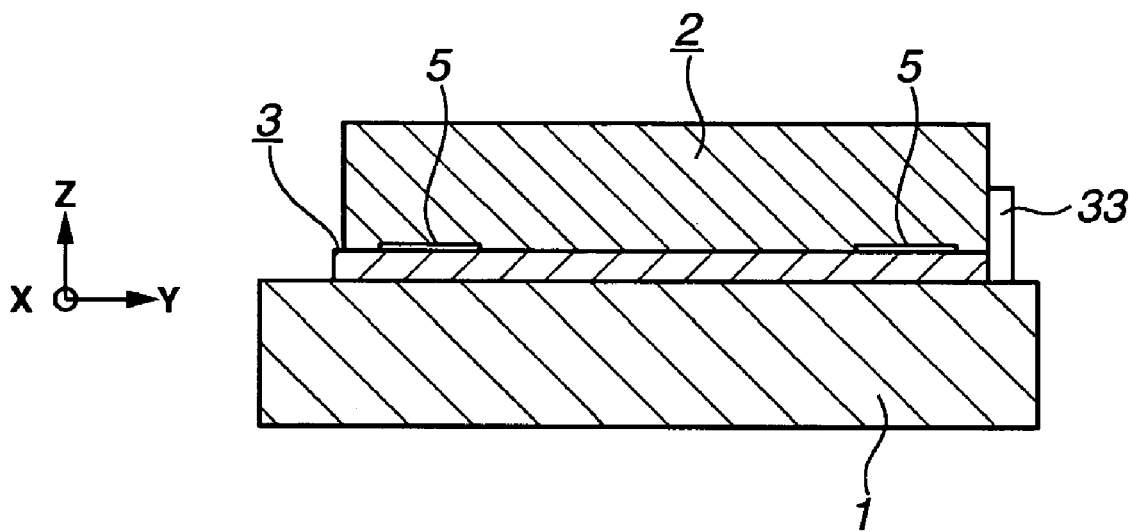
FIG. 6 is a cross-sectional view illustrating the apparatus of FIGS. 5A and 5B.

FIGS. 5A, 5B and 6 are, respectively, a plan view, an elevation and a cross-sectional view showing a positioning-completed state in which the stage apparatus 2 is positioned with respect to the X and Y directions, and brought into contact (abutment) with the reference members 31 to 33.

In general, a high precision measuring instrument, a semiconductor exposure apparatus, and the like, are disposed in a thermostatic chamber or a vacuum chamber. In the event that the auxiliary mount 7 is so constructed as to extend outside such a chamber, it is possible to use a conveying apparatus, such as a crane, during an operation for installing the stage apparatus 2 on the auxiliary mount 7. The assemblage operating efficiency of a semiconductor exposure apparatus, an electron-beam drawing apparatus, and the like, can be improved, and the maintenance cost thereof can also be reduced by the use of the positioning apparatus discussed above.

Figure 7A:
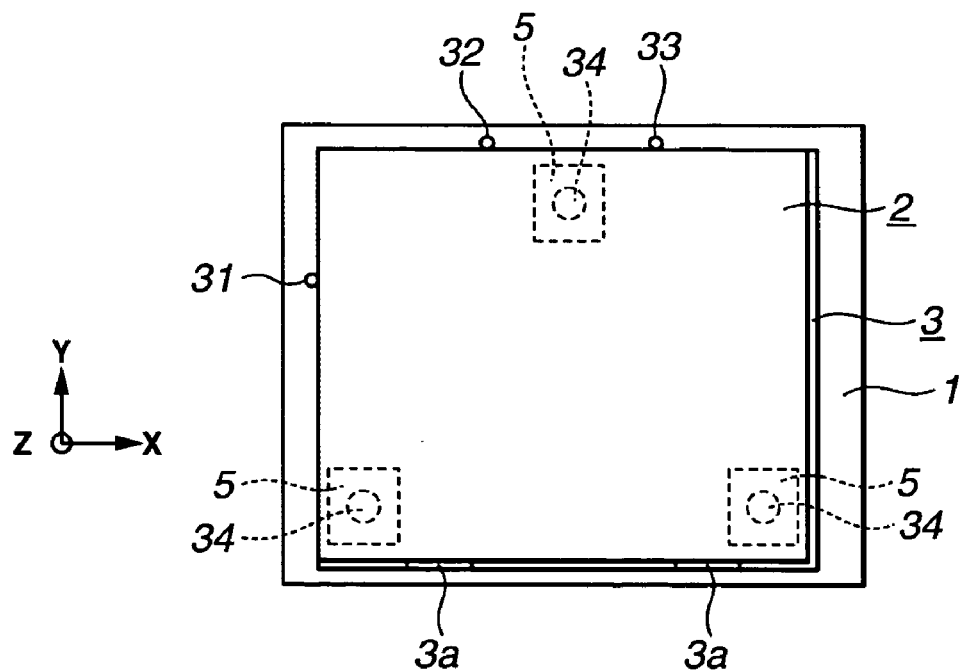
FIG. 7A is a plan view illustrating a second embodiment of a positioning apparatus according to the present invention.
Figure 7B:
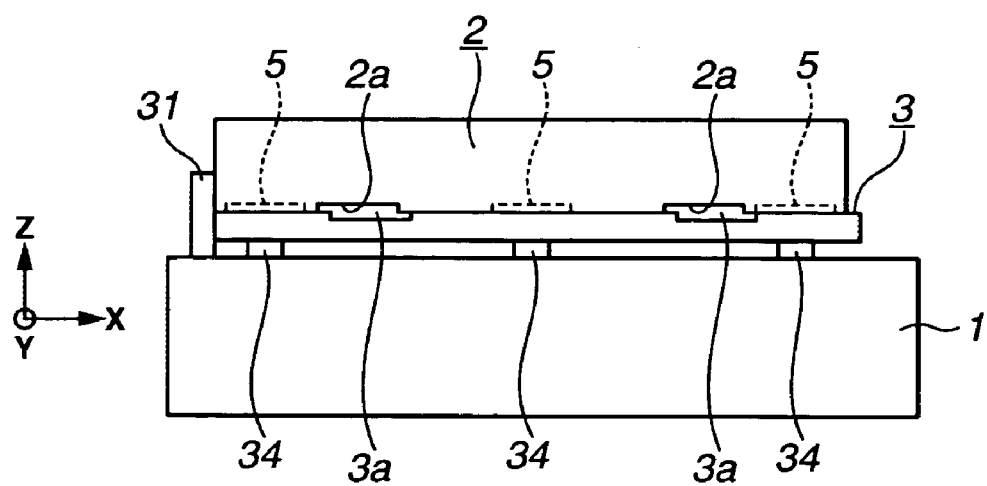
FIG. 7B is an elevational view of the apparatus shown in FIG. 7A.

A second embodiment of the present invention will be described with reference to FIGS. 7A and 7B. In the second embodiment, three spacers 34 serving as a supporting member are interposed between the above-discussed positioning mount 3 and base 1. The three spacers 34 are arranged approximately equiangularly about a center of gravity of the stage apparatus 2 and the positioning mount 3 to support the positioning mount 3 at three points.

Further, each hydrostatic bearing 5 is arranged at a location of each spacer 34 in a superimposing manner. Since the positioning mount 3 is thus supported at three points, the stage apparatus 2 is likewise supported substantially at three points, so that deformation of the stage apparatus 2 due to excessive constraints can be prevented. Furthermore, since the hydrostatic bearing 5 is disposed at the above-mentioned support point, deformation of the positioning mount 3 due to the injection of the compressed air can be reduced to the minimum degree. The second embodiment is the same as the first embodiment concerning the guide, auxiliary mount, and so forth, and a description thereof is, therefore, omitted.

Figure 8A:
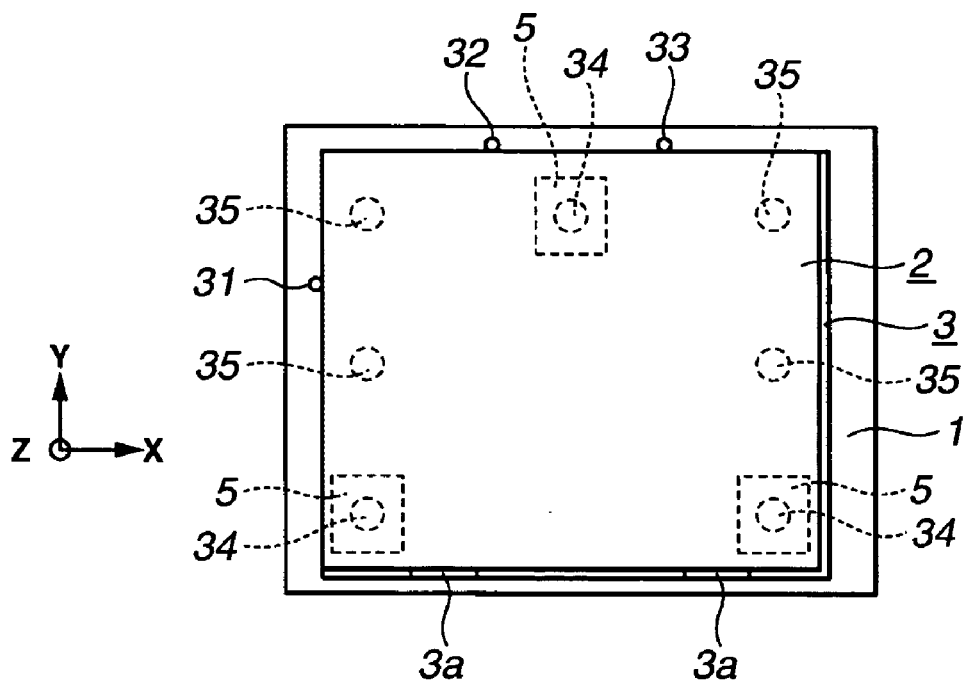
FIG. 8A is a plan view illustrating a modification of the second embodiment.
Figure 8B:
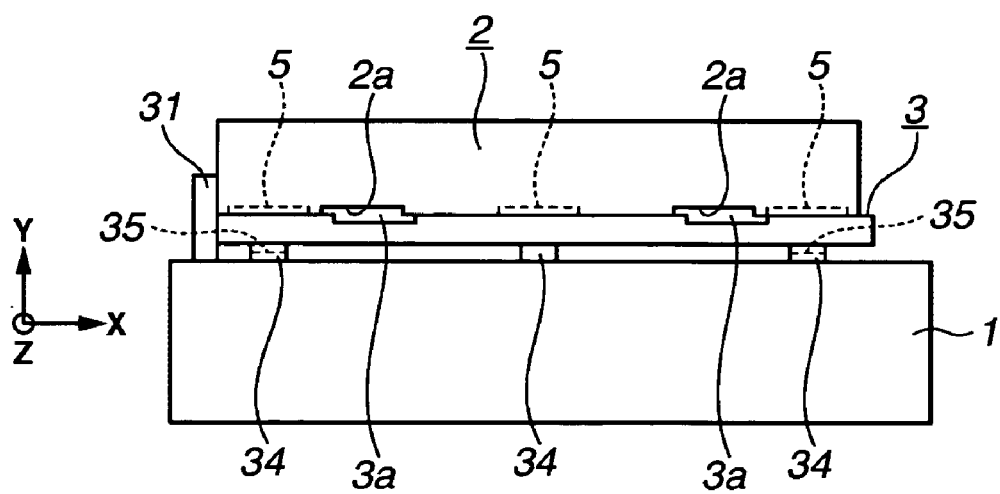
FIG. 8B is an elevational view of the apparatus shown in FIG. 8A.
Figure 9:
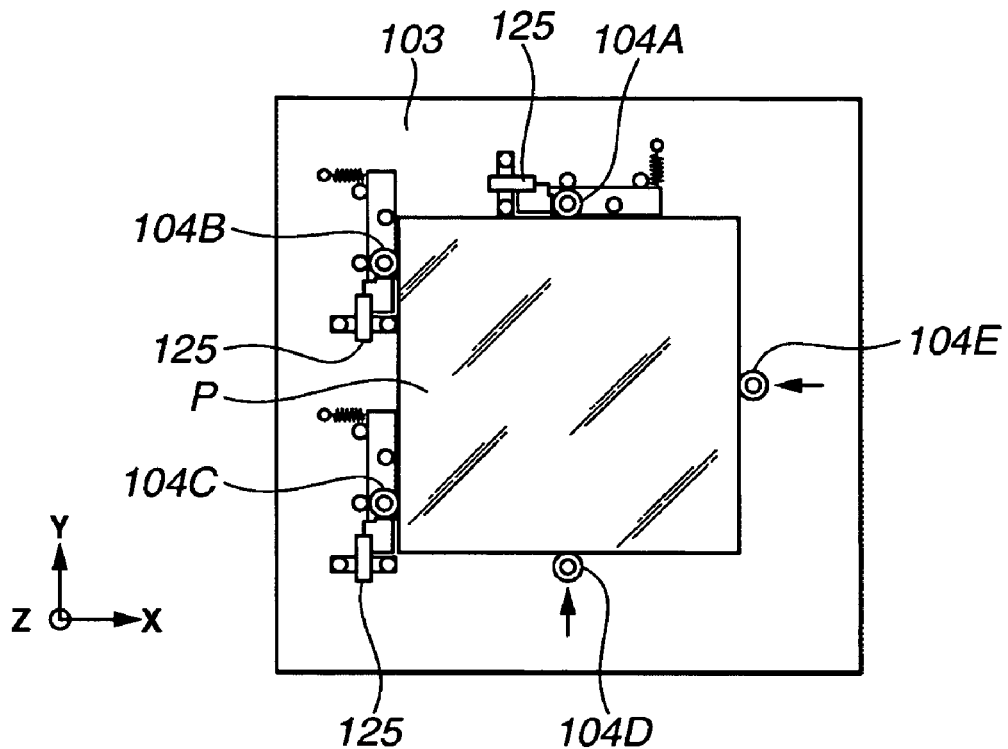
FIG. 9 is a view illustrating a conventional apparatus.
Figure 10:
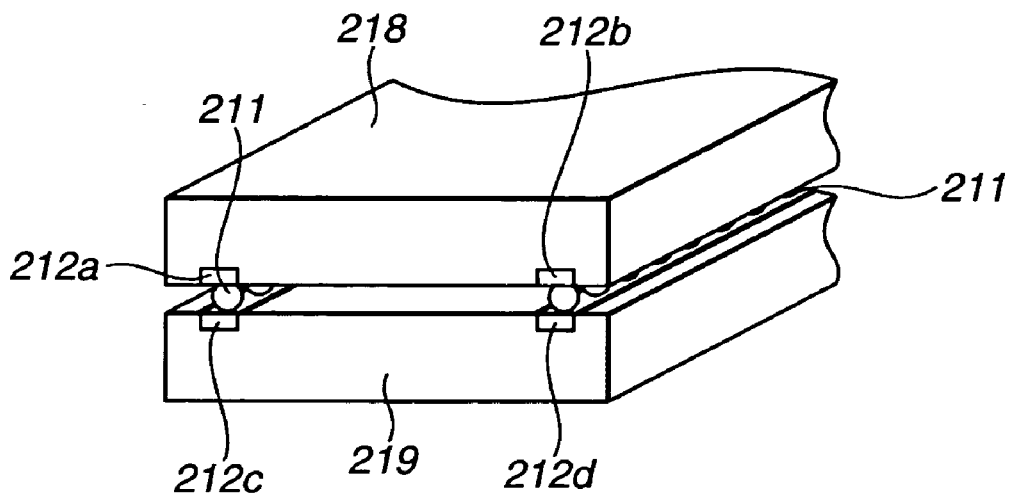
FIG. 10 is a view illustrating another conventional apparatus.

A modification of the second embodiment of the present invention will be described with reference to FIGS. 8A and 8B. In the modification, spacers 34 and butting members 35 are interposed between the above-discussed base 1 and positioning mount 3. The height of the butting member 35 is set to be smaller than that of the spacer 34 for supporting the positioning mount 3 by a small amount. When the stage apparatus 2 is moved from the auxiliary mount 7 to the positioning mount 3, deformation of the positioning mount 3 is likely to occur with the movement of the stage apparatus 2. At this time, when the positioning mount 3 deforms by the amount of a difference between the spacer 34 and the butting member 35, the bottom surface of the positioning mount 3 is brought into butting contact with the butting member 35, and supported thereby. Accordingly, the amount of deformation of the positioning mount 3 can be advantageously reduced to an amount below a predetermined amount.

In the embodiments discussed above, the roller 41 can be a ball serving as a rolling member. In this case, the stage apparatus 2 can be two-dimensionally moved on a plane within an allowable range permitted by the retainer 42, the guide grooves 2a and 3a, and so forth.

Further, the auxiliary base 6 for supporting the auxiliary mount 7 can be comprised of a self-supporting structure. The screw 11 for lifting the stage apparatus 2 can be assembled in the base 1. The cylinder 20 can be disposed in the stage apparatus 2. Moreover, the hydrostatic bearing 5 can be constructed on the side of the supporting surface of the positioning mount 3.

As discussed in the foregoing, in the positioning apparatus, the stage apparatus is conveyed onto the movement surface of the auxiliary mount, and moved to the supporting surface of the positioning mount of a body apparatus, such as an exposure apparatus, using the rolling guide, and the stage apparatus is then lifted using the lifting unit to extract the rolling guide. After that, the stage apparatus is lowered onto the supporting surface. When the stage apparatus is positioned while being in contact (abutment) with the reference member, the stage apparatus is caused to float from the supporting surface by the hydrostatic bearing unit.

When the stage apparatus is conveyed from the movement surface to the supporting surface, even a very heavy stage apparatus can be lightly moved because the weight of the stage apparatus is supported by the rolling guide.

When the stage apparatus is positioned on the supporting surface using the reference member, the rolling guide is extracted and the stage apparatus is then supported by the hydrostatic bearing unit in a non-contact manner. Accordingly, highly-precise positioning can be efficiently performed. It is thus possible to quickly and precisely position the stage apparatus for supporting a workpiece or a measurement object, and to drastically improve the assemblage efficiency of an exposure apparatus, and the like.

Except as otherwise discussed herein, the various components shown in outline or in block form in the Figures are individually well known and their internal construction and operation are not critical either to the making or using or to a description of the best mode of the invention.

While the present invention has been described with respect to what are at present considered to be the preferred embodiments, it is to be understood that the invention is not limited to the disclosed embodiments. The present invention is intended to cover various modifications and equivalent arrangements included within the spirit and the scope of the appended claims.

What is claimed is:

1. A positioning method comprising the steps of:
   moving a stage apparatus for supporting a workpiece or an object to be measured from an auxiliary mount to a positioning mount using a rolling guide extending from the positioning mount onto the auxiliary mount;
   lifting the stage apparatus moved to the positioning mount using a lifting unit to extract the rolling guide; and
   lowering the stage apparatus onto the positioning mount, from which the rolling guide is extracted, to cause the stage apparatus to abut a reference member and to position the stage apparatus, while hydrostatically supporting the stage apparatus by a hydrostatic bearing unit.

2. A positioning method according to claim 1, further comprising removing the auxiliary mount together with the extraction of the rolling guide.

3. A positioning apparatus comprising:
   a positioning mount with a reference member and a supporting surface for positioning a stage apparatus for supporting a workpiece or an object to be measured;
   an auxiliary mount with a movement surface forming an extension portion of the supporting surface of the positioning mount;
   a rolling guide for movably supporting the stage apparatus on the supporting surface and the movement surface;
   a hydrostatic bearing unit for establishing a non-contact relationship between the stage apparatus and the supporting surface; and
   a lifting unit for lifting the stage apparatus from the supporting surface.

4. A positioning apparatus according to claim 3, wherein the rolling guide includes a lower-side guide plate provided on the supporting surface and the movement surface in a detachably attachable manner, an upper-side guide plate provided on a lower surface of the stage apparatus in a detachably attachable manner, and a plurality of rollers rotatably held between the lower-side guide plate and the upper-side guide plate.

5. A positioning apparatus according to claim 3, wherein the positioning mount is supported at three points by three supporting members on a stationary base.

6. A positioning apparatus according to claim 5, further comprising three hydrostatic bearing units provided at places corresponding to the positions of the three supporting members, respectively.

* * * * *